United States Patent [19]

Prasad

[11] Patent Number: 5,274,569
[45] Date of Patent: Dec. 28, 1993

[54] DUAL SENSE NON-DIFFERENCING DIGITAL PEAK DETECTOR

[75] Inventor: Mohit K. Prasad, Tucson, Ariz.

[73] Assignee: International Business Machines Corporation, Armonk, N.Y.

[21] Appl. No.: 776,947

[22] Filed: Oct. 15, 1991

[51] Int. Cl.⁵ ............................................. G01R 29/02
[52] U.S. Cl. .................................. 364/486; 364/577; 364/569
[58] Field of Search ................. 364/577, 715.06, 572, 364/575, 577, 486, 569; 455/213; 382/29; 369/44.34; 73/861.28; 235/463; 360/45, 40; 370/8; 307/351

[56] References Cited

U.S. PATENT DOCUMENTS

| | | | |
|---|---|---|---|
| 3,727,079 | 4/1973 | Garrett | 307/235 |
| 3,831,194 | 8/1974 | Patel et al. | 360/45 |
| 4,064,408 | 12/1977 | Hon et al. | 307/351 |
| 4,135,161 | 1/1979 | Torrieri | 328/108 |
| 4,365,308 | 12/1982 | Heitmann | 364/577 |
| 4,658,368 | 4/1987 | Blais | 364/572 |
| 4,697,098 | 9/1987 | Cloke | 307/354 |
| 4,794,543 | 12/1988 | Enein et al. | 364/486 |
| 4,864,167 | 9/1989 | McKibben et al. | 307/351 |
| 4,926,442 | 5/1990 | Bukowski et al. | 307/351 |
| 4,949,289 | 8/1990 | Stephens et al. | 364/577 |
| 4,992,674 | 2/1991 | Smith | 307/351 |
| 5,025,176 | 6/1991 | Takeno | 307/351 |

Primary Examiner—Jack B. Harvey
Assistant Examiner—Thomas Peeso
Attorney, Agent, or Firm—M. W. Schecter; F. E. Anderson

[57] ABSTRACT

A dual sense non-differencing peak detector locates a peak without introducing unwanted noise components, and also corrects for signal asymmetries. This is accomplished by identifying two sequential sets of two successive samples each. The first set includes samples that fall on each side of a threshold voltage on the rising edge of the signal. The second set includes samples that fall on each side of the threshold on the falling edge of the signal. For each of the two sets of samples, the point at which the signal substantially equals the threshold is found by interpolation. The two threshold points, for a symmetrical signal, fall equidistant from the peak, and hence the peak is easily located as being equidistant therebetween.

22 Claims, 3 Drawing Sheets

DUAL SENSE NON-DIFFERENCING DIGITAL PEAK DETECTOR

FIELD OF THE INVENTION

This invention relates generally to the field of peak detectors and more particularly, to a digital peak detector which determines dual threshold voltage crossing points by interpolation and estimates a peak position therefrom.

BACKGROUND OF THE INVENTION

Data processing systems rely upon stored information for manipulating data and performing applications that the data processing systems are required to perform. The stored information can include an application program which instructs the data processing system, for example, on how to manipulate data, or the information can be the data itself. In any event, in all but the smallest applications, it is usually necessary to move the information from a storage medium to the data processing system's internal memory before processing can proceed. There exists many different forms of storage media for storing the information needed in the data processing systems.

Three typical forms of storage media include magnetic disks, optical disks and magnetic tape. A common form of magnetic disk storage media is direct access storage devices (DASD). DASD offers high storage capacity while providing relatively fast access to the information stored thereon. Optical disks are capable of storing larger amounts of information than DASD but require more time to access the stored information. Magnetic tape presently has the ability to store the largest amount of information but data access is much slower than DASD or optical disks. Magnetic tape's combination of high storage capacity, slow access speed, and low cost make it well suited for information back-up purposes Regardless of the storage medium used, the stored information must be read therefrom and converted into a form the data processing system can recognize. In the case of DASD and optical storage media, the information is stored on rigid discs that spin at a given speed while a read head, stationed just above the storage medium, recognizes the bits of 1's and 0's that make up the stored information and converts them into electrical signals. Magnetic tape is typically stored on a reel or cartridge and the tape is forced to travel across a tape read head at a given speed while the tape read head detects the information stored on the tape as it passes by the read head. When very large amounts of information are required to be retrieved from the storage medium, the time required to access that information is an important factor. The access time is a function of the speed at which the storage medium travels past the read head. However, increasing the storage medium speed generally results in increased read errors.

A common read error problem occurs as a result of timing failures. Each bit of information read from the storage medium must occur within a specified time window. If the position of the storage medium, for a given bit, is outside the expected time window, the data processing system will receive erroneous information. Hence, it is vital that the storage medium be synchronized to a data clock. Synchronization requires that the data clock be adjusted frequently by estimating a phase error between the bits of information read from the storage medium and the data clock. The phase error estimate is used to adjust the data clock.

The timing problem is further exacerbated since the data recovered from the storage medium is an analog signal requiring further processing to discriminate between binary ones and zeros. For example, a positive and/or negative pulse (above a predetermined threshold voltage) represents a binary one, and an absence of a pulse (below the threshold voltage) represents a binary zero. Conveniently, the peak of the pulse may be used to recover the timing information. Hence, each binary one recovered from the storage medium provides the opportunity to correct phase errors. The position of the peak for continuous-time signals (the analog signal) is the zero-crossing point of the signal's derivative.

The signal's derivative is input to a comparator and compared to a ground signal (zero volts). Thus, when the derivative equals zero, the comparator so indicates. Taking the derivative, however, poses at least two problems which cause errors resulting in clock jitter. First, taking the derivative introduces additional noise which is especially pronounced at low signal levels. Second, as the signal approaches zero volts, the noise causes many zero crossings. Garrett describes a circuit in U.S. Pat. No. 3,727,079 for reducing noise introduced by differentiation. Garret recognizes that the differentiated signal results in many false zero-crossings due to noise. Described by Garrett is a differential comparator for identifying zero-crossings, and associated latching circuitry to select a single zero-crossing while subsequent zero-crossings Cloke, in U.S. Pat. No. 4,697,098, describes a detecting circuit which also reduces errors. Cloke teaches using two threshold comparators for receiving a signal (a first comparator receives the signal after a delay, a second comparator receives the signal after differentiation). The differentiated signal is also input into a zero-crossing detector. Validation logic then determines, from the two comparators and the zero-crossing detector, which qualifies as the correct zero-crossing signal. An obvious drawback of the above approaches is the increased complexity, and hence increased cost, required.

The costs and reliability of systems can be improved by implementing prior analog circuits into digital systems. The digital systems can be fabricated in LSI (large scale integration) or VLSI (very large scale integration) circuits. In the discrete-time or digital systems, the continuous-time signal is represented by successive digital samples. Each digital sample consists of a predetermined number of bits, for example 4, wherein the bits are a binary representation of the magnitude of the continuous-time signal at the instant each sample is taken. Most often, the digital samples will not occur at a peak position and so the peak position must be estimated from the digital samples taken prior to and subsequent to the peak. A common method of predicting the peak position is by determining the zero-crossing point of the difference of two successive samples. This differencing operation, however, introduces noise, and fails to correct for peak asymmetry. Also, peaks that are not sharp are difficult to locate.

Thus what is needed is a digital peak detector that is able to accurately estimate peak locations, even though a signal may be asymmetrical, or the peak is relatively flat, without introducing noise.

SUMMARY OF THE INVENTION

Accordingly, it is an object of the present invention to provide an improved digital peak detector.

Another object of the present invention is to provide a digital peak detector that estimates the location of a peak without using differentiation.

Yet another object of the present invention is to provide a digital peak detector that estimates the location of a peak without introducing noise components while correcting for signal asymmetries.

Still another object of the present invention is to provide a digital peak detector for locating a signal's peak by identifying samples on each side of the peak, interpolating to locate the points where the signal equals a predetermined threshold voltage, and locating the peak midway therebetween.

These and other objects of this invention are accomplished by a dual sense digital peak detector for determining the center point of a signal pulse based upon samples taken therefrom. The dual sense digital detector includes first and second comparator circuits for identifying two sequential events. A first event includes two successive samples, wherein a first of which has an absolute value less than a threshold, and a second of which has an absolute value greater than or equal to the threshold. The second event also includes two successive samples, wherein a first of which has an absolute value greater than or equal to the threshold and a second of which has an absolute value less than the threshold. The sample of the first event that has an absolute value greater than or equal to the threshold may be the same sample of the second event that has an absolute value greater than or equal to the threshold. This implies that a minimum of three samples are required for the first and second events to be detected.

An interpolation circuit, coupled to the first and second comparator circuits, determines, by interpolation, a first point located between the two samples of the first event, wherein the signal pulse is substantially equal to the threshold. The interpolation circuit also determines a second point, by interpolation, located between the two samples or the second event, wherein the signal is again substantially equal to the threshold. Having determined the first and second points where the signal is equal to the threshold, the peak is estimated by finding a point equidistant therebetween.

The digital peak detector does not depend upon taking the derivative of the signal (or the difference between successive samples) and does not introduce noise by the processing thereof. Relatively flat peaks do not pose problems since once the threshold points are found, an ideal peak would be located centered between the two. Additionally, asymmetric signal errors can be minimized by choosing the threshold appropriately. An exact estimate is made when the pulse is symmetric.

The foregoing and other objects, features and advantages of the invention will be apparent from the following more particular description of the preferred embodiment of the invention, as illustrated in the accompanying drawing.

DESCRIPTION OF THE PREFERRED EMBODIMENT

Figure 1A:
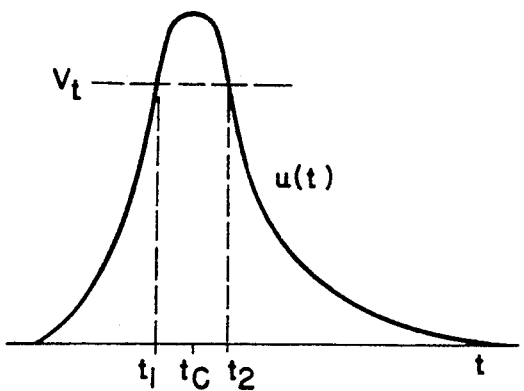
FIG. 1A is a signal diagram showing a signal pulse having a peak, the pulse crossing through a threshold.

FIG. 1A depicts a pulse of a continuous-time signal, $u(t)$, that represents a binary one. The test of whether a binary one is represented is simply whether the pulse exceeds a predetermined threshold voltage $v_t$. Importantly, timing information is associated with the pulse, that is, the pulse must properly coincide with a system clock. More specifically, the peak of the pulse should, occur relative in time to the clock. If the peak occurs too far prior or subsequent to the clock, the pulse will be mistaken for another bit of data and errors will ensue. The pulse occurs at time $t_c$, which is defined for a symmetrical signal by the equation:

$$t_c = 0.5*(t_1 + t_2). \tag{1}$$

The peak position of $u(t)$ does not always coincide exactly with $t_c$ due to the asymmetry. However, since asymmetry is caused by distortion in a channel, $t_c$ is closer to where the peak would have occurred in the absence of distortion. In analog systems, $t_c$ is found by taking derivatives of the continuous-time signal. It is often advantageous to take digital samples of the continuous-time signal and process the samples digitally. Digital processing of signals is more accurate and independent of component variations.

Figure 1B:
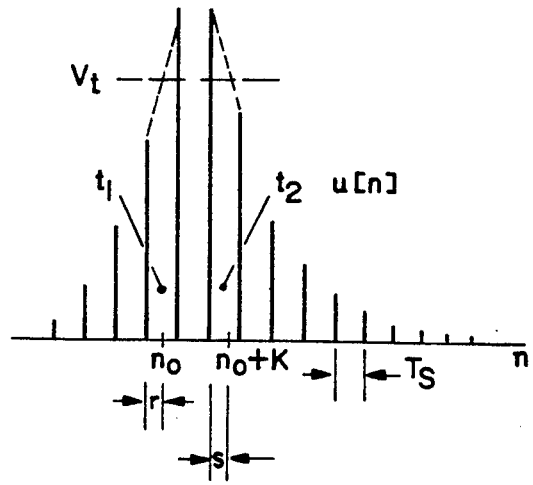
FIG. 1B is a signal diagram showing a plurality of digital samples taken of the analog signal pulse shown in FIG. 1A.

FIG. 1B shows a plurality of digital samples, $u\{n\}$, taken from the continuous-time signal $u(t)$, wherein n is an integer describing the nth digitized read pulse, and $T_s$ is the sampling period. Each digital sample is represented by a plurality of bits, i.e., eight bits, wherein the number of bits determines the resolution of the sample. Generally, the samples will not occur at $t_1$ or $t_2$, that is, when $u(t)$ equals $v_t$. Therefore, $t_1$ and $t_2$ will have to be computed from the digital samples prior to and subsequent to $v_t$. In the preferred embodiment, $t_1$ and $t_2$ are found by linear interpolation:

$$t_1 = (n_0 + r)T_s; \tag{2a}$$

$$t_2 = (n_0 + k - 1 + s)T_s; \tag{2b}$$

wherein $n_0$ is an index of a digital sample just prior to $v_t$ on the rising edge of the pulse; k is an integer representing a number of digital samples taken since $n_0$ and until $\{n\}$ is again less than $v_t$; and r and s are fractional values.

Using linear interpolation it is possible to determine the values of r and s:

$$r = (v_t - u\{n_0\})/(u\{n_0 + 1\}); \text{ and} \tag{3a}$$

$$s = (v_t - u\{n_0 + k - 1\})/(u\{n_0 + k\} - u\{n_0 + k - 1\} \tag{3b}$$

An assumption can be made that $t_c$ is located equidistant between $t_1$ and $t_2$. This assumption is valid when: the pulse is symmetric; or the asymmetry in the pulse is caused by distortions, as in most cases, viz. optics, DASD, and tapes; and the threshold, $v_t$, is chosen to minimize the effect of asymmetry. Using the assumption that $t_c$ is located equidistant between $t_1$ and $t_2$, $t_c$ can then be calculated from equations (1), (2a, b), and (3a, b) as:

$$t_c = (n_0 + (k-1)/2 + (r+s)/2) * T_s. \quad (4a)$$

Equation (4a) is simplified, without loss of generality by allowing $n_0$ to equal 0, thus $$t_c = (k - 1 + r + s)/2. \quad (4b)$$

In equation (4b), r and s are continuous variables which, in an actual digital system must be implemented as discrete values representing fractions of the clock period, $T_s$. Such a fractional value is conveniently represented by a gate delay, $T_G$, such that:

$$T_s = M * T_G, \quad (5)$$

wherein M is a positive integer. The fractional values $r/2$ and $s/2$ may then be replaced by non-negative integers, $p_r$ and $p_s$, respectively, wherein:

$$p_r = \{r * M/2\}; \text{ and} \quad (6a)$$

$$p_s = \{s * M/2\}; \quad (6b)$$

wherein {.} indicates the integer part of the argument. The peak position, $t_c$, is now defined as:

$$t_c = \{(k - 1 + r + s)/2\} * t_s + p_r * T_G + p_s * T_G. \quad (7)$$

Figure 2:
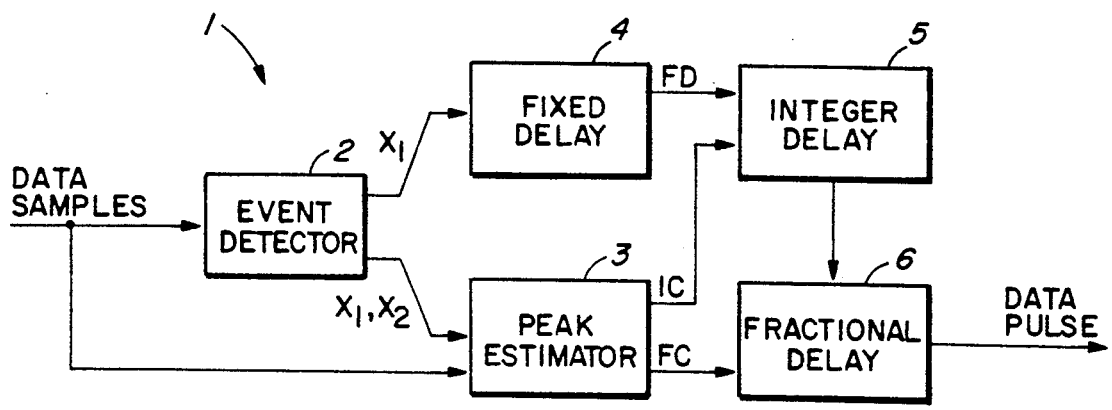
FIG. 2 is a block diagram of the digital peak detector.

Referring now to FIG. 2, a dual sense peak detector 1 is shown having an event detector 2, a peak estimator 3, a fixed delay 4, an integer delay 5, and a fractional delay 6. The event detector 2 receives digitized data samples of a data signal, for example, a data signal read from a storage medium. The event detector 2 determines when first and events occur. A first event, $X_1$, occurs when two successive samples have magnitudes less than, and greater than or equal to the threshold voltage, $v_t$, respectively. Similarly, a second event, $X_2$, occurs when two other successive samples have magnitudes greater than or equal to, and less than the magnitude of $v_t$, respectively. The event $X_1$ is input into the fixed delay 4 which provides a delay having a predetermined length, the delay being triggered by the event $X_1$. The delay provides sufficient time for the peak to be estimated by the peak estimator 3.

The peak estimator 3 receives both the digitized data samples and the event signals $X_1$ and $X_2$. The peak estimator 3 operates on successive samples to determine, when a pulse has been identified, where the peak is located. The peak location is referenced to $X_1$, wherein the peak is located by an appropriate delay from $X_1$ which includes an integer and fractional component. The integer component, IC, is input into the integer delay 5, wherein the integer delay 5 provides a delay substantially equal to the calculated integer component. The fractional component, FC, is input into the fractional delay 6, wherein the fractional delay 6 provides a delay substantially equal to the calculated fractional component. The fixed delay 4 outputs a predetermined fixed delay, FD, which is connected to the integer delay 5. The output of the integer delay 5 is connected to an input of the fractional delay 6. The integer and fractional delays are added to the fixed delay, FD, such that the output of the fractional delay 6 is a data pulse that occurs at the time of the peak plus the fixed delay.

Figure 3:
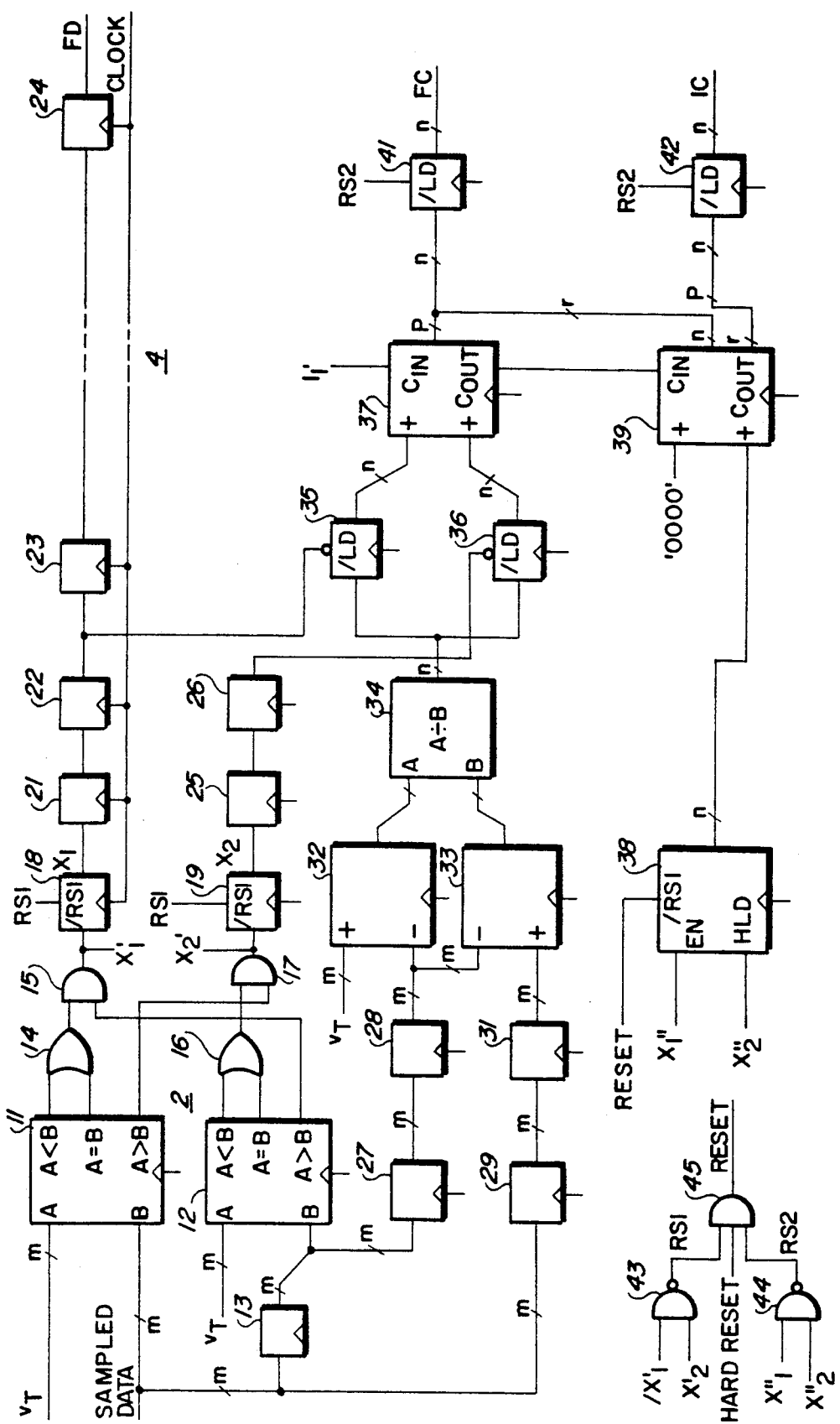
FIG. 3 is a schematic diagram of blocks 2, 3, and 4 as shown in FIG. 2.

FIG. 3 is a schematic diagram of the event detector 2, the peak estimator 3, and the fixed delay 4. The event detector 2 includes a comparator 11, a comparator 12, and a register 13 for simultaneously comparing the magnitudes of two successive data samples to $v_t$. If two successive samples meet the requirements necessary for the event $X_1$ to occur, logic gates 14-15 will cause a signal $X'_1$ to go "high". Similarly, if another two successive samples meet the requirements necessary for the event $X_2$ to occur, the logic gates 16-17 will cause a signal $X'_2$ to go "high". Each comparator 11 and 12 has $v_t$ applied to an A input, and the comparator 11 has the data samples applied to a B input. The register 13 also has the data samples applied to an input and has an output connected to a B input of the comparator 12. A clock signal, CLOCK, is also connected to the register 13 for enabling a data sample to be loaded on each clock cycle. The comparators 11 and 12 each have the clock connected thereto for operating synchronously. Hence comparator 11 is comparing a current data sample, for example $u\{n_0 + 1\}$, while the comparator 12 is comparing a previous data sample, for example $u\{n_0\}$. In the present embodiment, each data sample is made up of eight data bits, m. The register 13 thus includes eight storage elements and the A and B inputs of the comparators 11 and 12 are eight bits wide.

The comparator 11 has an A<B output and an A=B output connected to inputs of an OR gate 14, and the comparator 12 has an A<B output and an A=B output connected to inputs of an OR gate 16. An output of each OR gate 14 and 16 is connected to an input of each AND gate 15 and 17, respectively. Also, an A>B output of each comparator 11 and 12 is connected to another input of each AND gate 17 and 15, 21 respectively. The AND gate 15 provides the $X'_1$ signal at an 22 output and the AND gate 17 provides the $X'_2$ signal at an output. The outputs of the AND gates 15 and 17 are connected to an input of registers 18 and 19, respectively. Registers 18 and 19 are single bit registers, having a /RS1 input (active "low" reset) connected to a RS1 signal, and having a clock input connected to the clock signal. The event signals, $X_1$ and $X_2$, are made available at the outputs of the registers 18 and 19, respectively.

The following example illustrates how events $X_1$ and $X_2$ are detected. Referring back to FIG. 1B. at time $n_0$, data sample $u\{n_0\}$ is made available to the comparator 11 and data sample $u\{n_0 - 1\}$ has previously been loaded into the register 13. The comparisons made by the comparators 11 and 12 results in the A<B and the A=B outputs of both comparators 11 and 12 to be "low" since the magnitudes of both $u\{n_0 - 1\}$ and $u\{n_0\}$ are less than magnitude of $v_t$. The outputs of the OR gates 14 and 16 are also "low" thereby disabling the AND gates 15 and 17, respectively. Hence, neither event $X_1$ or $X_2$ has been detected. At time $n_0 + 1$, the data sample $u\{n_0\}$ is stored in the register 13 and made available at the B input of the comparator 12, and the data sample $u\{n_0 + 1\}$ is made available at the B input of comparator 11. This time the A<B output of the comparator 11 is "high" while the A<B and the A=B outputs of the comparator 12 remain low ($v_t$ is greater than $u\{n_0\}$, and the A>B output is high. The output of the OR gate 14 is high causing the output of the AND gate 15, $X'_1$, to go "high". $X'_1$ is loaded into the register 18 and $X_1$ is available one clock cycle later signifying the event $X_1$ has occurred.

Detecting event $X_2$ is similar, wherein the data sample $u\{n_0+k\}$ is made available to the comparator 11 and the data samples $u\{n_0+k-1\}$ is made available to the comparator 12 at time $n_0+k$. This time the A>B output of the comparator 11 is "high" ($v_t$ is greater than $u\{n_0+k\}$), and the A<B output of the comparator 12 is "high" ($v_t$ is less than $u\{n_0+k-1\}$). The output of the OR gate 16 goes "high" and the output of the AND gate 17, $X'_2$, also goes "high". $X'_2$ is loaded into the register 19 and $X_2$ is available a clock cycle later signifying the event $X_2$ has occurred.

The fixed delay 4 is made up of registers 21-24, wherein each register has a clock input connected to the clock signal. The register 21 has an input connected to the of the register 18 ($X_1$), and the registers 21-24 are sequentially connected. In the preferred embodiment, the fixed delay is 15 clock cycles and hence, there are eleven additional registers coupled between the registers 23 and 24. When the event $X_1$ detected, a "one" is propagated through the registers 21-24 such that fifteen clock cycles later the FD signal at an output of the register 24 goes "high". $X_1$ is thus a reference from which an additional calculated delay will be added for locating the peak.

The peak estimator 3 receives successive data samples that are delayed three clock cycles and two clock cycles, respectively, by registers 27 and 28, and 29 and 31, respectively. The register 27 has an input connected to the output of the register 13, and the register 29 has an input connected for directly receiving the data samples. The register 28 has an input connected to an output of the register 27, and the register 31 has an input connected to an output of the register 29. Each of the registers 27-29, and 31 are made up of m storage elements and each and are connected to the clock signal. The sampled data appears at the output of the register 31 delayed by two clock cycles, and at the output of the register 28 delayed by three clock cycles. The output of the register 28 is connected to a negative input of adders 32 and 33. The threshold voltage, $v_t$, is applied to a positive input of the adder 32, and the output of the register 31 is connected to a positive input of the adder 33. Each adder 32 and 33 has the clock signal connected thereto.

The adder 33 determines the difference between successive data samples. Simultaneously, the adder 32 determines the difference between each data sample and $v_t$. An output of the adder 32 is input into an A input of a divider 34. Likewise, an output of the adder 33 is input into a B input of the divider 34. The divider 34, being connected to the clock signal, divides the A input by the B input on each clock cycle. An output of the divider 34, being made up of n bits, is connected to an input of registers 35 and 36. A load input, /LD, of the register 35 is connected to an output of the register 22. As a result, the only time the register 35 is loaded with the division performed by the divider 34 is after an event $X_1$ has occurred (the division of the event $X_1$ occurs two clock cycles later and so loading the register 35 is delayed two clock cycles). By design, the outputs of the adders 32 and 33 are always non-zero with the same sign. Thus, problems associated with divide by zero or division by two arguments with dissimilar signs never occur when the events $X_1$ or $X_2$ are detected. Moreover, the output of the divider 34 is always positive. Two registers, 25 and 26, are sequentially connected to an output of the register 19 for receiving the event $X_2$ signal. An output of the register 26 is connected to a load input, /LD, of the register 36. Hence, the register 36 will store the results of a division performed by the divider 34 only after an event $X_2$ has been detected. Each register 35 and 36 is made up of n storage elements, each being connected to the clock signal.

Continuing with the previous example, after the event $X_1$ has been detected, the data sample $u\{n_0\}$ is made available at the negative input of the adders 32 and 33. Also, the data sample $u\{n_0+1\}$ is made available at the positive input of the adder 33. The adder 32 thus calculates $v_t-u\{n_0\}$, and the adder 33 calculates $u\{n_0+1\}-u\{n_0\}$. On the next clock cycle, the divider 34 divides the A input by the B input, or $(v_t-u\{n_0\})/u\{n_0+1\}-u\{n_0\})$ which is equal to r as shown in equation (3a). One clock cycle later, the result r is loaded into the register 35. In the preferred embodiment, r is represented by four bits, n. However, it will be appreciated by those skilled in the art that the number of bits n may vary depending upon the degree of accuracy desired.

Determining s is similar to determining r. After the event $X_2$ has been detected, the data sample $u\{n_0+k-1\}$ is made available at the negative inputs of the adders 32 and 33. Also, the data sample $u\{n_0+k\}$ is made available at the positive input of the adder 33. The adder 32 thus calculates $v_t-u\{n_0+k-1\}$, and the adder 33 calculates $u\{n_0+k\}-u\{n_0+k-1\}$. On the next clock cycle, the divider 34 divides the A input by the B input, or $(v_t-u\{n_0+k-1\})/(u\{n_0+k\}-u\{n_0+k-1\}$ which is equal to s as shown in equation (3b). One clock cycle later, the result s is loaded into the register 36.

An output of the register 35, having n bits, is connected to an input of an adder 37. An output of the register 36, also having n bits, is connected to another input of the adder 37. The clock signal is connected to the adder 37, and a logical "one" is connected to a carry in input, $C_{IN}$. The outputs of the adders 35 and 36, r and s, respectively, are added in the adder 37. A counter 38 has a signal $X''_1$ connected to an enable input, EN, wherein $X''_1$ is equivalent to $X'_1$ delayed by one clock cycle. The signals $X''_1$ and $X''_2$ differ from $X_1$ and $X_2$, respectively, in that $X''_1$ and $X''_2$ remain "high" until $X'_2$ goes "high" while $X'_1$ stays "low". Another signal, $X''_2$ is connected to a hold input, HLD, of the counter 38, wherein $X''_2$ is equivalent to $X'_2$ delayed by one clock cycle. The counter 38 has a clock input connected to the clock signal, and has another input, /RST, connected to a RESET signal. The counter 38 counts the number of data samples taken between the event X and the event $X_2$, or k-1.

An output of the counter 38, having n bits, is connected to an input of an adder 39. A second input of the adder 39 is connected to a logical "0000" so that the data sample count is not changed by adding to it. A carry out, $C_{OUT}$, of the adder 37 is connected to a $C_{IN}$ input of the adder 39. The three most significant bits (MSBs) of an output of the adder 37, and the least significant bit (LSB) of an output of the adder 39, are connected to an input of a register 41. An output of the register 41 provides the signal FC which is connected to the fractional delay 6. The three MSBs of the output of the adder 39, and the $C_{OUT}$ of the adder 39 are connected to an input of a register 42. An output of the register 42, IC, is connected to the integer delay 5. The counters 37 and 39 and the registers 41 and 42 are both connected to the clock signal. Each register 41 and 42 has a /LD input connected to a RS2 signal.

A shift right operation is effectively performed by connecting the three MSBs of the counter 37 and the LSB of the counter 39 to the register 41. The effect of shifting right is to divide the adder 37 and 39 results by two, hence the input to the register 41 is the fractional part of $(k-1+r+s)/2$. That is, the fractional delay is derived from equation (4b). Likewise, connecting the three MSBs and the $C_{OUT}$ of the adder 39 to the register 42 provides the integer portion of $(k-1+r+s)/2$. That is, the integer delay is derived from equation (4b). Equation (4b) has effectively been calculated by the peak estimator 3 with the fraction and integer portions separated into registers 41 and 42, respectively. The fractional and integer delays are realized electronically by the fractional delay 6 and the integer delay 5, respectively.

Resetting the several registers shown in FIG. 3 is accomplished by a specific reset circuit. A NAND gate 43 has a $/X'_1$ signal and the $X'_2$ signal connected to its inputs and provides the RS1 signal at its output. A NAND gate 44 has the $X''_1$ and the $X''_2$ signals connected to its inputs and provides the RS2 signal at its output. An AND gate 45 has the RS1 and RS2 signals connected to two inputs, and additionally has a hard reset signal connected to another input. The RESET signal is provided at an output of the AND gate 45.

Figure 4:
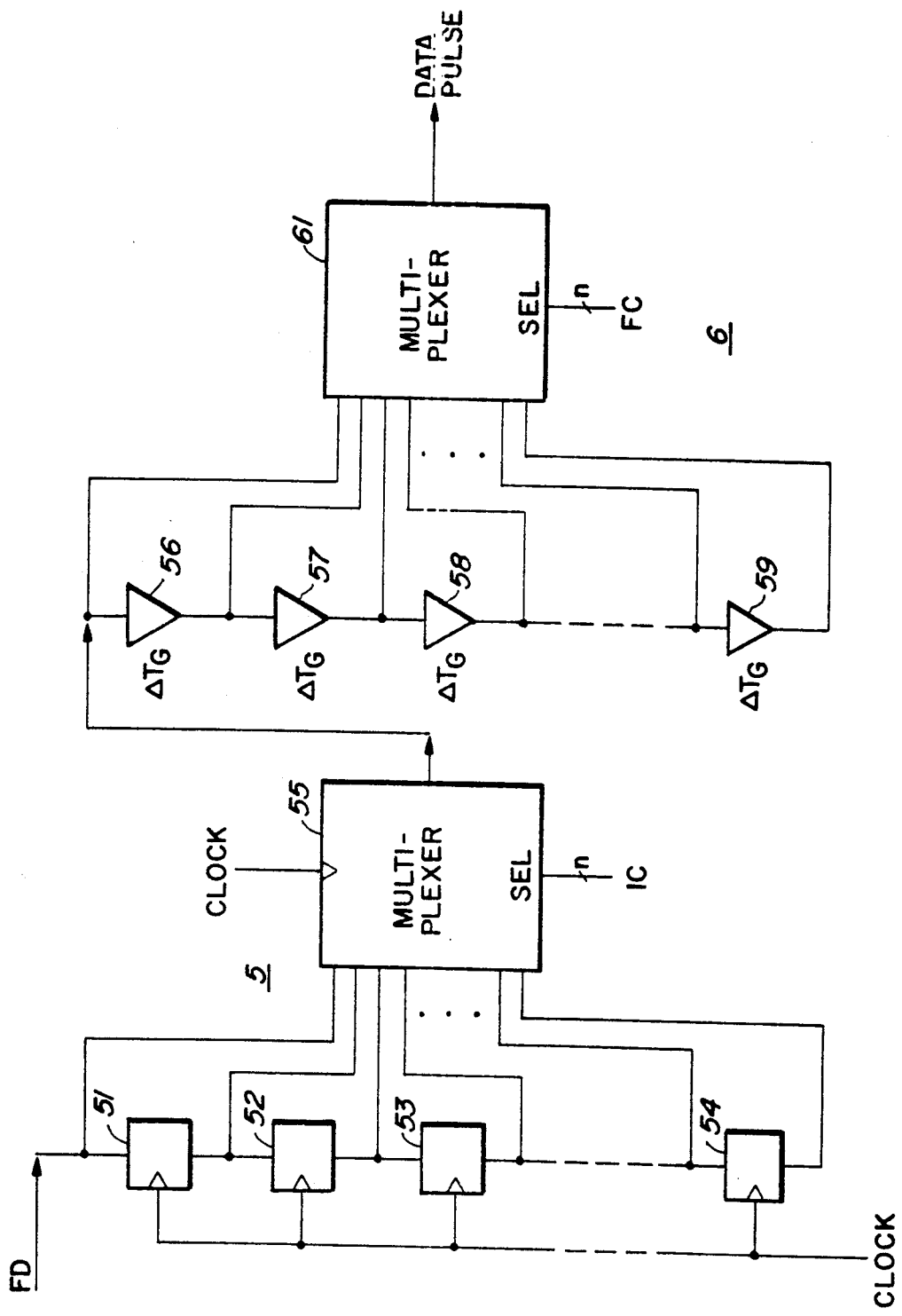
FIG. 4 is a schematic diagram of blocks 5 and 6 as shown in FIG. 2.

Referring now to FIG. 4, the integer delay 5 and the fractional delay 6 are shown in greater detail. The integer delay 5 includes a plurality of registers 51-54 sequentially connected, and each register 51-54 is connected to the clock signal. Each register 51-54 provides a delay of one (a data sample is taken on each clock cycle and each register is clocked on each clock cycle). A multiplexer 55 is also provided having 16 multiplexed inputs, the first input connected to the FD signal, and the remaining inputs each connected to an output of a register 51-54. In the preferred embodiment, fifteen registers are provided, wherein the number of registers to be included in the integer delay is determine by the IC signal which is made up of four bits. The IC signal is connected to a select input, SEL. of the multiplexer 55. The clock signal is also connected to the multiplexer 55.

The FD signal is also connected to the input of the register 51. As a result, after the event $X_1$ signal has propagated through the fixed delay 4, FD is delayed an additional number of clock signals according to IC (IC may equal zero in which case no additional delay is added). An output of the multiplexer 55 is connected to a first input of a multiplexer 61, and further connected to an input of a 28 buffer 56. Additional buffers 57-59 are serially connected with an output of each being connected to a respective input of the multiplexer 61. Each buffer 56-59 provides a fraction of a single integer delay as described by equations (5) and (6a,b). The FC signal is connected to a select input, SEL. of the multiplexer 61. In the preferred embodiment, the OP1 signal is four bits for selecting none or one to 15 buffers as are provided for creating the fractional delay portion. Whereas the multiplexer 55 is clocked and is therefore synchronous, and the multiplexer 56 has is not clocked and is therefore asynchronous.

An output of the multiplexer 61 provides a data pulse which represents the fixed delay plus the integer delay portion plus the fractional delay portion. The peak is thus located by adding the the integer delay portion and the fractional delay portion to the event $X_1$ The fixed delay has been introduced for allowing the calculation of the integer and fractional portions of the delay. Since all peak locations are shifted by a constant value equal to the fixed delay, the relative position of the peaks remain unchanged. Hence, the addition of a fixed delay has no effect on the peak locations. The peak has thus been determined without taking the derivative of the pulse and additional noise errors have not been introduced.

A small error may result from having a finite number of buffers in generating the fractional delay portion. This delay may be minimized by choosing the appropriate number of buffers (the number of buffers chosen are of course limited by the number of bits, n, used in determining the fractional delay). The multiplexor 61 may also introduce a very small error due to different data paths within the multiplexor 61 having different delays. Such differences are small in most integrated circuits and can usually be ignored.

While the invention has been particularly described with reference to particular embodiments thereof, it will be understood by those skilled in the art that various other changes in detail may be made therein without departing from the spirit, scope, and teaching of the invention. The invention has been described using a positive pulse as an example, but it will be understood by those skilled in the art that the invention applies equally to negative pulses. The invention is further applicable to other than data transfer functions, for example, the invention is applicable to image processing, wherein gray level information is carried on signal edges, and the edge locations are determined from the peak locations of the derivatives.

Accordingly, the invention herein disclosed is to be limited only as specified in the following claims.

What is claimed is:

1. A dual sense peak detector for determining the peak point of a signal pulse based upon samples taken therefrom; comprising:

first means for identifying a first event, the first event including two successive samples, wherein a first of the two samples has an absolute magnitude less than a threshold, and a second of the two samples an absolute magnitude greater than the threshold, the first means also identifying a second event, wherein the second event includes two other successive samples, wherein a first of the two other samples has an absolute magnitude greater than the threshold and a second of the other two samples has a magnitude less than the threshold;

second means for determining a first point located between the two samples, wherein a magnitude of the signal is substantially equal to the threshold, and for determining a second point located between the other two samples, wherein another magnitude of the signal is substantially equal to the threshold; and third means coupled to the first and second means for determining a peak position of the signal as a function of the first and second points.

2. The peak detector according to claim 1 wherein the first and second points are determined by interpolating between the two samples, and the other two samples, respectively.

3. The peak detector according to claim 2 wherein the third means determines the peak position as being equidistant between the first and second points.

4. The peak detector according to claim 3 wherein the third means calculates a delay, the delay being substantially equal to a time from the first of the two samples to the peak position.

5. The peak detector according to claim 4 further comprising a fourth means coupled to the first and third means for providing the delay.

6. The peak detector according to claim 5 wherein the second of the two samples and the first of the other two samples is the same sample, such that the peak location is estimated from three samples.

7. A method of estimating a peak location of a pulse, the pulse being a portion of a continuous signal, wherein digital samples of the continuous signal are made at predetermined intervals, each digital sample being represented by a predetermined number of bits, the method comprising the steps of:

identifying a first event, the first event including first successive samples, wherein a first sample has a magnitude less than a threshold and a second sample has a magnitude greater than or equal to the threshold;

identifying a second event, including second successive samples, wherein a third sample has a magnitude greater than the threshold, and a fourth sample having a magnitude less than or equal to the threshold;

determining a first time point, r, wherein r is a time relative to the first sample and prior to reaching the peak, whereat the continuous signal substantially equals the threshold;

determining a second time point, s, wherein s is a time relative to the third sample and subsequent to the peak, whereat the continuous signal substantially equals the threshold;

determining a time point, c, wherein c is equidistant between r and s; and adding the time c to the time of the first sample thereby estimating the peak location.

8. The method according to claim 7 wherein the magnitude of the signal must at least equal the threshold for a peak to be detected.

9. The method according to claim 7 wherein determining the time point r step comprises interpolating between the first and second samples.

10. The method according to claim 9 wherein interpolating to find r comprises subtracting the magnitude of the first sample from the threshold and dividing by the magnitude of second sample less the magnitude of the first sample.

11. The method according to claim 7 wherein determining the time point s step comprises interpolating between the third and fourth samples.

12. The method according to claim 11 wherein interpolating to find s comprises subtracting the magnitude of the fourth sample from the threshold and dividing by the magnitude of the third sample less the magnitude of the fourth sample.

13. The method according to claim 12 wherein the time c comprises an integer and a fractional component.

14. The method according to claim 13 wherein a magnitude of r is added to a magnitude of s for determining the fractional component.

15. The method according to claim 14 wherein the number of samples taken after the beginning of the first event and before the end of the second event are counted to determine the integer component.

16. A peak detector for processing digital samples of a continuous signal read from a storage medium, the peak detector locating a peak of the continuous signal as a function of the digital samples, comprising:

comparator means coupled for receiving the digital samples for setting a first flag if a magnitude of a first digital sample is less than a first threshold and a magnitude of a second digital sample is greater than or equal to the first threshold, and setting a second flag if a magnitude of a third digital sample is greater than a second threshold and a magnitude of a fourth digital sample is less than or equal to the second threshold;

interpolation means coupled for receiving the digital samples and to the comparator means for interpolating to find r, r being a point between the first and second digital samples wherein the magnitude of the continuous signal is substantially equal to the first threshold, r being stored as a function of the first flag, the interpolation means further interpolating to find s, s being a point between the third and fourth samples wherein the magnitude of the continuous signal is substantially equal to the second threshold, s being stored as a function of the second flag;

peak predicting means coupled to the interpolation means for calculating a delay for locating a peak of the continuous signal relative to the first digital sample, the delay having a fractional component determined as a function of r and s, and an integer component determined as a function of a number of digital samples taken; and delay means coupled to the peak calculating means for providing the calculated delay.

17. The peak detector according to claim 16 wherein a magnitude of the first threshold is substantially equal to a magnitude of the second threshold.

18. The peak detector according to claim 17 wherein the magnitude of the continuous signal must exceed the magnitude of the first threshold for a binary one to be detected.

19. The peak detector according to claim 18 wherein the comparator means comprises:

a first comparator having a first input coupled for receiving the first threshold and a second input coupled for receiving the digital samples;

a first register having an input for receiving the digital samples and having an output; and a second comparator having a first input coupled for receiving the second threshold and a second input coupled to the output of the first register for receiving delayed digital samples such that successive digital samples are compared to the first and second thresholds, respectively, simultaneously by the first and second comparators, respectively.

20. The peak detector according to claim 19 wherein the comparator means further comprises:

first storage means coupled to the first comparator for storing the first flag; and second storage means coupled to the second comparator for storing the second flag.

21. The peak detector according to claim 20 wherein the peak predicting means comprises:

a first adder coupled for simultaneously receiving, at first and second inputs, the first digital sample and the threshold for calculating a first difference therebetween and subsequenty receiving at the first input the third digital sample for determining a second difference therebetween;

a second adder coupled for simultaneously receiving, at first and second inputs, the first and second digital samples for calculating a third difference therebetween, and subsequently, simultaneously receiving at the first and second inputs the third and fourth samples for calculating a fourth difference therebetween;

a divider circuit coupled to the first and second adders for dividing the first difference by the third difference for determining r, and subsequently dividing the second difference by the fourth difference for determining s;

a first register coupled to the divider circuit for storing r;

a second register coupled to the divider circuit for storing s; and a third adder coupled to the first and second registers for adding r and s for providing the fractional portion of the delay.

22. The peak detector according to claim 21 wherein the interpolation means further comprises:

a counter coupled for counting a number of digital samples occurring after the first sample and up to and including the fourth sample; and a fourth adder coupled to the counter and to the third adder for providing the integer portion of the delay.

* * * * *